United States Patent
Wickersham, Jr. et al.

(10) Patent No.: US 7,425,093 B2
(45) Date of Patent: Sep. 16, 2008

(54) THERMOGRAPHY TEST METHOD AND APPARATUS FOR BONDING EVALUATION IN SPUTTERING TARGETS

(75) Inventors: Charles E. Wickersham, Jr., Columbus, OH (US); Zhiguo Zhang, Columbus, OH (US); Larry Edwin Ellison, Wellston, OH (US); Mikhail Y. Kachalov, Virginia Beach, VA (US); John D. White, III, Columbus, OH (US)

(73) Assignee: Cabot Corporation, Boston, MA (US)

( * ) Notice: Subject to any disclaimer, the term of this patent is extended or adjusted under 35 U.S.C. 154(b) by 251 days.

(21) Appl. No.: 10/890,378

(22) Filed: Jul. 13, 2004

(65) Prior Publication Data
US 2005/0147150 A1    Jul. 7, 2005

Related U.S. Application Data

(60) Provisional application No. 60/488,243, filed on Jul. 16, 2003.

(51) Int. Cl.
*G01B 11/02* (2006.01)
*G01N 25/00* (2006.01)
*G01N 25/72* (2006.01)
*G01N 3/00* (2006.01)
*G01J 5/00* (2006.01)

(52) U.S. Cl. .......................... 374/5; 374/120; 374/130; 374/57; 356/399.2

(58) Field of Classification Search ................ 374/120, 374/121, 4–5, 57, 4.5, 44, 124, 129, 141, 374/7, 43
See application file for complete search history.

(56) References Cited

U.S. PATENT DOCUMENTS

| | | | | |
|---|---|---|---|---|
| 4,517,070 | A | * | 5/1985 | Kisner .................. 204/298.09 |
| 4,633,307 | A | * | 12/1986 | Honda ....................... 378/98.5 |
| 4,752,140 | A | * | 6/1988 | Cielo et al. .................... 374/55 |
| 4,861,618 | A | * | 8/1989 | Vine et al. ................... 427/454 |
| 4,895,592 | A | * | 1/1990 | Hatwar et al. .............. 75/10.14 |
| 5,032,727 | A | | 7/1991 | Cox, Jr. et al. ............. 250/330 |
| 5,230,462 | A | * | 7/1993 | Vascak et al. .............. 228/222 |
| 5,246,291 | A | | 9/1993 | Lebeau et al. .................. 374/5 |
| 5,377,126 | A | * | 12/1994 | Flik et al. ................... 700/300 |
| 5,522,535 | A | * | 6/1996 | Ivanov et al. ............ 228/122.1 |

(Continued)

FOREIGN PATENT DOCUMENTS

CN    57106938    7/1988

(Continued)

OTHER PUBLICATIONS

International Search Report and Written Opinion for PCT/US2004/022402 dated Jun. 15, 2005.

(Continued)

*Primary Examiner*—Gail Verbitsky (57) ABSTRACT

A method and apparatus for thermographically evaluating the bond integrity of a sputtering target assembly is described. The method includes applying a heating or cooling medium or energy to one surface of the assembly and acquiring a graphic recording of a corresponding temperature change on the opposing surface of the assembly using an imaging device. Also described is a method of mathematically analyzing the pixel data recorded in each frame to produce an integrated normalized temperature map that represents the bond integrity of the assembly.

46 Claims, 10 Drawing Sheets

U.S. PATENT DOCUMENTS

| | | | |
|---|---|---|---|
| 5,562,345 A | 10/1996 | Heyman et al. | 374/5 |
| 5,582,485 A | 12/1996 | Lesniak | 374/5 |
| 5,631,465 A | 5/1997 | Shepard | |
| 5,688,049 A * | 11/1997 | Govorkov | 374/44 |
| 5,709,469 A | 1/1998 | White et al. | 374/5 |
| 5,711,603 A | 1/1998 | Ringermacher et al. | 374/5 |
| 5,834,661 A | 11/1998 | Nonaka et al. | 73/866 |
| 5,836,506 A * | 11/1998 | Hunt et al. | 228/172 |
| 6,000,844 A * | 12/1999 | Cramer et al. | 374/5 |
| 6,033,107 A * | 3/2000 | Farina et al. | 374/5 |
| 6,040,226 A * | 3/2000 | Wojnarowski et al. | 438/381 |
| 6,065,072 A * | 5/2000 | Flath | 710/29 |
| 6,092,427 A * | 7/2000 | Hunt et al. | 73/835 |
| 6,111,424 A | 8/2000 | Bosacchi | 324/770 |
| 6,267,501 B1 * | 7/2001 | Wand et al. | 374/124 |
| 6,316,054 B1 * | 11/2001 | Kashiwaya et al. | 427/249.1 |
| 6,382,920 B1 * | 5/2002 | Dopper | 416/241 R |
| 6,387,715 B1 | 5/2002 | Davis et al. | 438/16 |
| 6,394,646 B1 * | 5/2002 | Ringermacher et al. | 374/7 |
| 6,451,185 B2 * | 9/2002 | Beier et al. | 204/298.12 |
| 6,555,250 B2 * | 4/2003 | Shah et al. | 428/652 |
| 6,568,846 B1 * | 5/2003 | Cote et al. | 374/5 |
| 6,739,196 B2 * | 5/2004 | Leybovich | 73/620 |
| 6,748,959 B1 * | 6/2004 | Kashiwaya et al. | 134/1.1 |
| 7,083,327 B1 * | 8/2006 | Shepard | 374/46 |
| 2001/0005392 A1 * | 6/2001 | Schutz et al. | 374/5 |
| 2002/0006153 A1 * | 1/2002 | Ranson et al. | 374/161 |
| 2002/0050566 A1 | 5/2002 | Nilsson et al. | |
| 2002/0172410 A1 | 11/2002 | Shepard | |
| 2002/0176988 A1 * | 11/2002 | Medwick et al. | 428/408 |
| 2002/0185372 A1 | 12/2002 | Hunt et al. | |
| 2003/0042131 A1 * | 3/2003 | Johnson | 204/192.12 |
| 2003/0055594 A1 | 3/2003 | Bunker et al. | |
| 2004/0016635 A1 * | 1/2004 | Ford et al. | 204/192.1 |
| 2004/0076216 A1 * | 4/2004 | Chamberlain et al. | 374/57 |
| 2004/0120383 A1 * | 6/2004 | Kennedy et al. | 374/57 |
| 2005/0002435 A1 * | 1/2005 | Hashimoto et al. | 374/43 |
| 2005/0011749 A1 * | 1/2005 | Kachalov et al. | 204/192.12 |
| 2005/0236266 A1 * | 10/2005 | Poole et al. | 204/192.13 |
| 2006/0058643 A1 * | 3/2006 | Florent et al. | 600/423 |
| 2008/0006528 A1 * | 1/2008 | Gilman et al. | 204/298.12 |

FOREIGN PATENT DOCUMENTS

| | | |
|---|---|---|
| DE | 198 32 833 A1 | 2/2000 |
| GB | 2164147 A * | 3/1986 |
| JP | 01165755 A * | 6/1989 |
| WO | WO 01/41421 A2 | 6/2001 |
| WO | WO 02/37089 A1 | 5/2002 |
| WO | WO 02/089042 A1 | 11/2002 |
| WO | WO 02/099157 A1 | 12/2002 |

OTHER PUBLICATIONS

English translation of Office Action from Chinese Patent Application No. 200480023364.6, eight pages.

* cited by examiner

THERMOGRAPHY TEST METHOD AND APPARATUS FOR BONDING EVALUATION IN SPUTTERING TARGETS

This application claims the benefit under 35 U.S.C. §119 (e) of prior U.S. Provisional Patent Application No. 60/488,243 filed Jul. 16, 2003, which is incorporated in its entirety by reference herein.

BACKGROUND OF THE INVENTION

The present invention relates to sputtering target assemblies comprised of a sputter target bonded to a backing plate. More particularly, the present invention relates to methods for quantitatively evaluating sputter target/backing plate bond quality, and to systems for performing nondestructive bond evaluation of sputtering target assemblies.

In the sputter application field, a sputtering target assembly typically includes a sputter target and a backing plate. For instance, a metal target or metal target blank (e.g., tantalum, titanium, aluminum, copper, cobalt, tungsten, etc.) is bonded onto a backing plate. The backing plate can be, for example, a backing plate flange assembly such as copper, aluminum, or alloys thereof. Among the factors that can affect sputtering performance of a given sputtering target assembly is the degree of thermal and electrical contact maintained between the sputter target and the backing plate during the sputtering process. To achieve the desired thermal and electrical contact between the sputter target and the backing plate, the sputtering target assembly members are bonded or attached to each other by conventional means such as soldering, brazing, diffusion bonding, clamping, explosion bonding, friction welding, press fitting, epoxy cementing, and the like. The degree of thermal and electrical contact achieved in the bonding process can depend on the quality of the bond throughout the entire bond interface located between the bonding surfaces of the sputtering target assembly members.

The sputter target and the backing plate are typically made from materials having dissimilar coefficients of thermal expansion. The differential expansion between the target material and the backing plate material that occurs when bonding is accomplished at elevated temperatures such as by soldering, brazing, or diffusion bonding, can generate very high levels of mechanical stress in the metal of the sputtering target assembly members. The mechanical stress can cause deflection of the sputtering target assembly, leading to separation of the sputter target from the backing plate due to bond failure. Bond failure due to poor bonding can occur anytime during handling but is most likely to occur during use, when bond strength or shear strength can be at a minimum due to exposure to relatively high temperatures attained in the sputtering process. The debonding risk is even more possible due to the continuing progression of the industry to use larger and larger sputter targets.

For at least the reasons discussed, i.e., sputtering performance and shear failure, sputtering target assemblies bonded by conventional methods are typically inspected for bond quality prior to use to assure that the bond integrity is satisfactory. Ultrasonic scanning or testing (UT) is typically used in evaluating the bond integrity between the target and the backing plate in a sputtering target assembly. In UT, the target/backing plate assembly is immersed in water and an ultrasonic transducer operating between about 1 to 30 MHz, is used to scan in an x-y raster pattern over the sputtering target assembly surface. Bond integrity throughout the bond interface can be determined by measuring the ultrasonic reflection from the target/backing plate interface. For areas in which no strong reflection is detected, the bond is deemed to be sound. Alternatively, if a strong reflection is detected, the associated regions are deemed to be poorly bonded.

Scanning time for UT of sputtering target assemblies is proportional to the area being scanned. A typical scan rate for a sputtering target assembly is approximately 15 to 30 $cm^2$/min. A typical sputtering target assembly, e.g. for coating 200 mm silicon wafers for semiconductor fabrication, can be about 1,000 $cm^2$. Thus, typical scan times are 30 to 60 minutes. Evaluations of this duration are disadvantageous for numerous reasons. In addition, the accuracy of the results obtained by ultrasonic testing can be related to the manner in which the scanning is conducted. Further, it is advantageous to reduce the data obtained regarding debond location to a readily observable medium such as a graphic image.

Accordingly, a need exists for a method of evaluating the bond integrity of a sputtering target assembly that requires less time to perform than currently used evaluation methods. A need also exists for a system for performing non-destructive examination of a sputtering target assembly that provides a quantitative analysis in which the accuracy of the results are not subject to the inherent limits of mechanical scanning. A further need exists for a method to present assembly debond location information in a representative map.

SUMMARY OF THE PRESENT INVENTION

It is therefore a feature of the present invention to provide a method of non-destructive examination for detecting non-bonded areas of a bonded sputter target/backing plate assembly.

A further feature of the present invention is to provide a method of evaluating a bond interface of a sputtering target assembly in which evaluation time is independent of the size of the evaluation area.

Another feature of the present invention is to provide a thermographic system of evaluating a bond interface of a sputtering target assembly that produces consistent bond quality analyses.

Additional features and advantages of the present invention will be set forth in part in the description that follows, and in part will be apparent from the description, or may be learned by practice of the present invention. The objectives and other advantages of the present invention will be realized and attained by means of the elements and combinations particularly pointed out in the description and appended claims.

To achieve these and other advantages, and in accordance with the purposes of the present invention, as embodied and broadly described herein, the present invention relates to a method of evaluating a bond interface of a sputtering target assembly using a thermographic analysis of the sputtering target assembly that includes a backing plate bonded or otherwise attached to a sputter target at the bond interface. The method preferably includes heating or cooling the backing plate with a heat source or heat sink, respectively; imaging at least a portion of a surface of the sputter target via infrared thermography to acquire a sequence of thermographic images of individual pixels of a pixel matrix for a predetermined imaging time to produce an observed time-temperature curve for individual pixels; and comparing the observed time-temperature curves to corresponding reference time-temperature curves to determine the integrity of the bond interface.

The present invention also relates to a method of thermography analysis that preferably includes determining a time-temperature curve for individual pixel data obtained from a sequence of thermographic images acquired for a predetermined imaging time via infrared thermography; and integrating a plurality of the time-temperature curves over an imaging time to obtain an observed integrated temperature for individual pixels. The method optionally includes normalizing the individual pixel data. The observed integrated temperatures can also be represented in an integrated pixel map.

The present invention further relates to a method of heating a sputtering target assembly member to cause heat to flow perpendicularly to a bond interface such that for unsound bonds the heat transport is reduced, thereby creating detectable temperature gradients on the surface of the sputter target/backing plate assembly that can be used in isolating debonded areas in the assembly.

It is to be understood that both the foregoing general description and the following detailed description are exemplary and explanatory only and are intended to provide a further explanation of the present invention, as claimed.

The accompanying drawings, which are incorporated in and constitute a part of this application, illustrate various aspects of the present invention and together with the description, serve to explain the principles of the present invention.

DETAILED DESCRIPTION OF THE PRESENT INVENTION

A method according to the present invention for evaluating a bond interface of a sputtering target assembly includes conducting a thermographic analysis of the sputtering target assembly which includes a backing plate and a sputter target bonded or otherwise attached together at the bond interface. The thermographic analysis preferably includes heating or cooling the backing plate with a heat source or a heat sink, respectively; imaging at least a portion of a surface of the sputter target via infrared thermography to acquire a sequence of thermographic images of individual pixels of a pixel matrix for a predetermined imaging time to produce an observed time-temperature curve for individual pixels; and comparing the observed time-temperature curves to corresponding reference time-temperature curves to determine the integrity of the bond interface. The method optionally further includes integrating the observed time-temperature curves for a plurality of the individual pixels over at least a portion of the imaging time to obtain an observed integrated temperature for the plurality of pixels; and comparing the observed integrated temperature to a corresponding reference integrated temperature to thereby determine the integrity of the bond interface.

In more detail, the sputtering target assembly, as described above, includes two components or assembly members, i.e., a backing plate and a sputter target. The sputter target used to practice the present invention includes two sides, a sputtering side and an opposing bonding side. The backing plate of the present invention includes two sides, a bonding side and an opposing back side. The sputtering target assembly of the present invention is one that is assembled by fixing the bonding sides relative to each other. The sputtering target assembly can be one that has a target and a backing plate attached directly or indirectly to one another by any suitable technique, the technique preferably being bonding. The bond can be a metallurgical bond, such as a bond achieved by diffusion bonding, explosion bonding, press metal fitting (e.g., one having intercalated protrusions and grooves), thermal expansion coupling, electron beam (e-beam) welding, inertia welding, friction brazing, and the like, or by soldering techniques. A bond interface is defined by an area between the bonding sides of the bonded assembly members. The sputtering target assembly can also have an interlayer as is conventional in the industry. The interlayer can be made of any suitable metal or alloy thereof, including the metals discussed above for targets and backing plates. Furthermore, the sputter target can be a hollow cathode magnetron (HCM) sputter target and can be other forms of sputter targets such as planar magnetron assemblies adapted to incorporate stationary or rotating permanent or electromagnets. The backing plate can include features such as a flange and/or be adapted to include or connect to cooling devices.

The sputter target and the backing plate can be any suitable target grade and backing plate grade materials, respectively. Examples of the target materials include, but are not limited to, aluminum, titanium, copper, cobalt, niobium, gold, platinum, palladium, nickel, hafnium, molybdenum, zirconium, tantalum, and alloys thereof. Examples of the backing plate include, but are not limited to, copper, or a copper alloy, tantalum, niobium, titanium, aluminum, and alloys thereof, such as TaW, NbW, TaZr, NbZr, TaNb, NbTa, TaTi, NbTi, TaMo, NbMo, and the like, and steel. Preferably, the sputter target is tantalum or a tantalum alloy, and the backing plate is a copper or a copper alloy. No limitation exists as to the type of materials used in the sputter target and the backing plate. The purity, texture, and/or grain size and other parameters, including size and the like are not critical to the present invention. Preferably, the materials of the sputtering target assembly members provide a heat transfer coefficient with an ambient atmosphere of from about 0.1 to about 300 W/m². The thicknesses of the sputter target and the backing plate can be any suitable thickness used for sputtering target assemblies. Examples of suitable thicknesses of the backing plate and of the sputter target include, but are not limited to, a backing plate with a thickness of from about 0.25 inches or less to about 2 inches or more, and a target with a thickness ranging from about 0.06 inches or less to about 1 inch or more.

Heating can be achieved by heating either or both of the sputtering target assembly members, and is preferably heating of the backing plate. Heating can be by any direct or indirect method of applying heat to substantially all or any portion of any of the non-bonding sides of the assembly member, and preferably includes the sputtering side of the sputter target or the back side of the backing plate. Prior to heating, the sputtering target member can be at a temperature of from about 15 to about 35° C., and is preferably at an ambient temperature of about 20° C. Also prior to heating, the assembly members are preferably at an equilibrium temperature. The assembly member can be heated to a temperature of from about 20 to about 100° C. Preferably, the method of heating rapidly heats the assembly member to which heat is applied. Preferably, heating heats the assembly member at a rate of from about 0.01 to about 100° C./sec, such as about 0.1 to about 10° C./sec.

The heat source can be any heat source suitable for heating the sputtering target assembly member. For instance, the heat source can be a fluid including water, ethylene glycol, cesium formate, or any combination thereof. The heat source can be a liquid bath or a liquid spray, e.g., steam or hot liquid spray and the like. The heat source can be a gas, e.g., hot air, helium, argon, nitrogen or other gas system. The heat source can be radiant heat or conductive heat. The heating can be induction heating. The heat source can be an induction coil that heats the target assembly by inducing eddy currents in the target assembly, e.g., the backing plate surface. Any device capable of inducing eddy currents can be used. Preferably, when a heat source (e.g., liquid) is used to heat the assembly, the method that is used has properties of high heat capacity and good thermal conductivity. The heat capacity and thermal conductivity of the heat source are preferably sufficient to rapidly heat the entire sputtering target assembly. The heat source preferably has a specific heat capacity of at least about 4,000 J/Kg·K. Preferably, a convective heat transfer coefficient is provided between the heat source and the assembly member being heated of from about 500 to about 20,000 W/m².

According to one embodiment of the present invention, rather than heating the assembly, the assembly is alternatively subjected to cooling. Cooling can be by any direct or indirect method of removing heat from substantially all or any portion of any of the non-bonding sides of the assembly member, and preferably includes the sputtering side of the sputter target or the back side of the backing plate. Prior to cooling, the sputtering target member can be at a temperature of from about 15 to about 100° C., and is preferably at an ambient temperature of about 20° C. Also prior to cooling, the assembly members are preferably at an equilibrium temperature. The assembly member can be cooled to a temperature of from about 0 to about −273° C. Preferably, the method of cooling rapidly cools the assembly member from which heat is removed. Preferably, cooling cools the assembly member at a rate of from about 0.1 to about 10° C./sec.

Cooling can be achieved by using a heat sink. The heat sink can be any heat sink suitable for cooling the sputtering target assembly member. For instance, the heat sink can be a fluid including water, ethylene glycol, or cesium formate. The heat sink can be a liquid bath or a liquid spray. The heat sink can be a gas, e.g., air, helium, argon, nitrogen or other gas system. Preferably, the heat sink used to cool the assembly member has properties of high heat capacity and good thermal conductivity. The heat capacity and thermal conductivity of the heat sink are preferably sufficient to rapidly cool the entire sputtering target assembly. The heat sink preferably has a specific heat capacity of at least about 4,000 J/Kg·K. Preferably, a convective heat transfer coefficient is provided between the heat sink and the assembly member being cooled of from about 500 to about 20,000 W/m².

Figure 1:
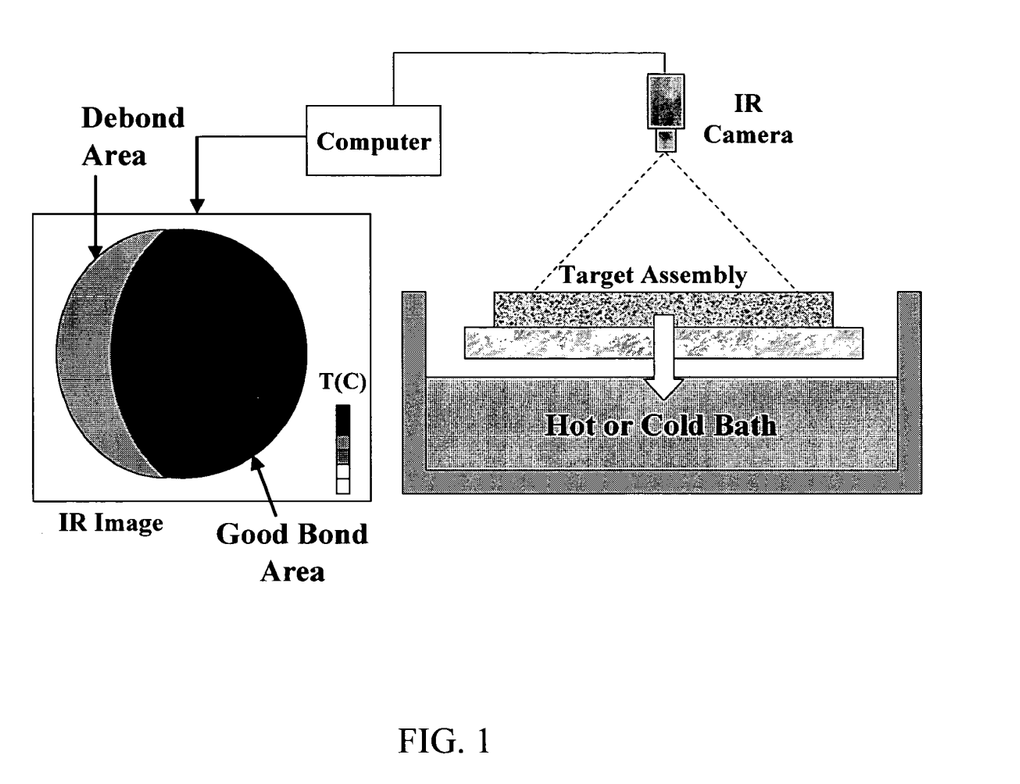
FIG. 1 is a schematic diagram of a system that embodies features of the present invention for evaluating a bond interface of a sputtering target assembly.
Figure 2:
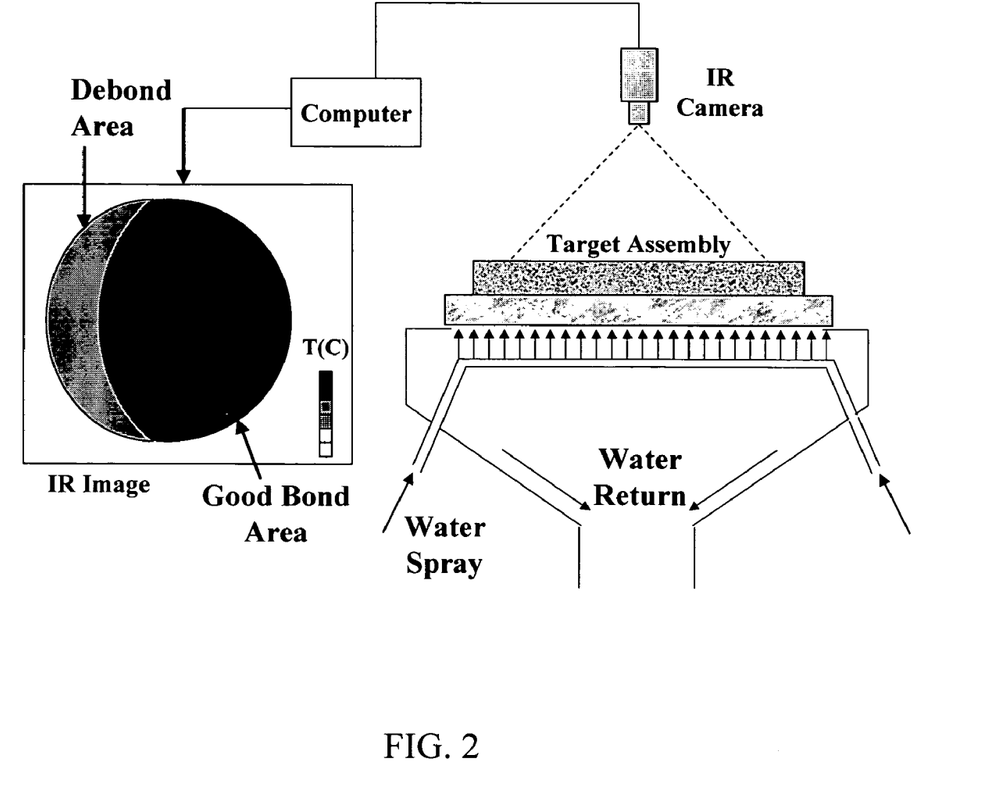
FIG. 2 is a schematic diagram of another version of a system that embodies features of the present invention for evaluating a bond interface of a sputtering target assembly.

According to one embodiment of the present invention, a thermographic system of evaluating a sputtering target assembly comprised of a backing plate bonded to a sputter target, includes heating or cooling an assembly member by immersion in a water bath. The assembly member can be lowered into contact with the water bath, the water bath raised to contact the assembly member, or both, for example, using a mechanical system(s). Also, the fluid level in a stationary bath-target system can be raised to the assembly member by using a combination of pumps and drains to rapidly raise the fluid level so contact with the assembly member is made. FIGS. 1 and 2 provide illustrations of two exemplary systems for heating or cooling the sputtering target assembly. The illustrations show planar sputtering target assembly configurations, but other sputtering target assembly shapes can be used, such as cylindrical or conical sputtering target assemblies. FIG. 1 shows an exemplary water bath arrangement. FIG. 2 provides an illustration of a spray method for heating the assembly member. In this case, the heating fluid is sprayed onto the back side of the backing plate.

According to one embodiment of the present invention, temperature measurements of the exposed face of the non-heated (or non-cooled) assembly member can be achieved by imaging at least a portion of a surface of the assembly member (preferably the sputter target). In general, imaging preferably produces a graphic record of thermal changes over the imaged surface that can then be analyzed in the time domain. Surface temperature changes are related to characteristic dynamics of heat flow through the bond interface resulting from the thermal gradient generated in the sputtering target assembly by heating or cooling an assembly member as described above. The heat flow is easily passed through the bond interface when a good bond is present. However, when the bond is discontinuous, the poorly bonded area impedes the heat transfer. In this case, the rate of temperature change on the exposed face of the non-heated (or non-cooled) assembly member in the immediate area of the poor bond will be measurably lower. Temporal measurements of the exposed surface of the assembly member can be measured to ascertain bond quality in any area of the bond interface.

In more detail, an infrared (IR) video camera can be used to record and store successive thermographic images (frames) of all or any portion of the exposed surface of the assembly member. Each video image is composed of a fixed number of individual pixels. In this context, a pixel is a small picture element in an image array or pixel matrix which corresponds to a rectangular area or resolution element on the surface of the imaged assembly member. Since, the intensity of each pixel is directly related to the temperature of the corresponding resolution element, temperature changes at each resolution element on the assembly member surface can be analyzed in terms of changes in pixel contrast. The stored video images can be used to determine the contrast of each pixel in an image frame by subtracting the mean pixel intensity for a particular image frame, representing a known point in time, from the individual pixel intensity at that same point in time.

Preferably, the IR camera acquires a series of images of the exposed surface of the assembly member (e.g., the sputtering side opposing the bonding side) for a predetermined imaging time as heat energy flows across the sputter target/backing plate bond interface. The predetermined imaging time can be of from about 1 to about 500 sec. The sequence of thermographic images can be acquired at a frequency of from about 0.01 to about 100 frames/sec. The IR camera can have a thermal sensitivity of from about 0.01 to about 1° C. Imaging can be by any method. For example, methods of using infrared thermography to measure bond integrity in aircraft structures, flat panel displays, and the like are described in U.S. Pat. Nos. 5,709,469; 5,582,485; 5,562,345; 5,246,291; and 5,032,727 which are incorporated in their entirety herein by reference.

Preferably, any non-uniform temperature distribution across the face of the imaged assembly member caused by the non-uniform assembly geometry and the non-uniform heating or cooling is accounted for. Preferably, the variation in the ambient temperature of the sputtering target assembly and the heat source or heat sink temperature is accounted for. A method for taking these and other factors into account such that a single bond integrity map that is corrected for geometrical, heat flow, and temperature variations is generated, is provided by integrating the normalized temperature over the frames obtained in the video recording of the thermographic analysis. This procedure can be described mathematically by first defining the normalized temperature for each pixel in each frame using the relationship:

$$T_N(x,y,t)=(T(x,y,t)-T_o)/(T_f(x,y)-T_o) \quad \text{(Eq. 1)}$$

wherein $T_N(x,y,t)$ and $T(x,y,t)$ are the normalized temperature and the measured temperature, respectively, for the pixel located at x,y in the frame, and t is the time at which the particular video frame was captured; $T_o$ is the ambient temperature of the assembly member prior to starting the measurement; and $T_f(x,y)$ is the temperature of the assembly member surface recorded by the infrared camera in the final frame used in the thermographic analysis.

Figure 3:
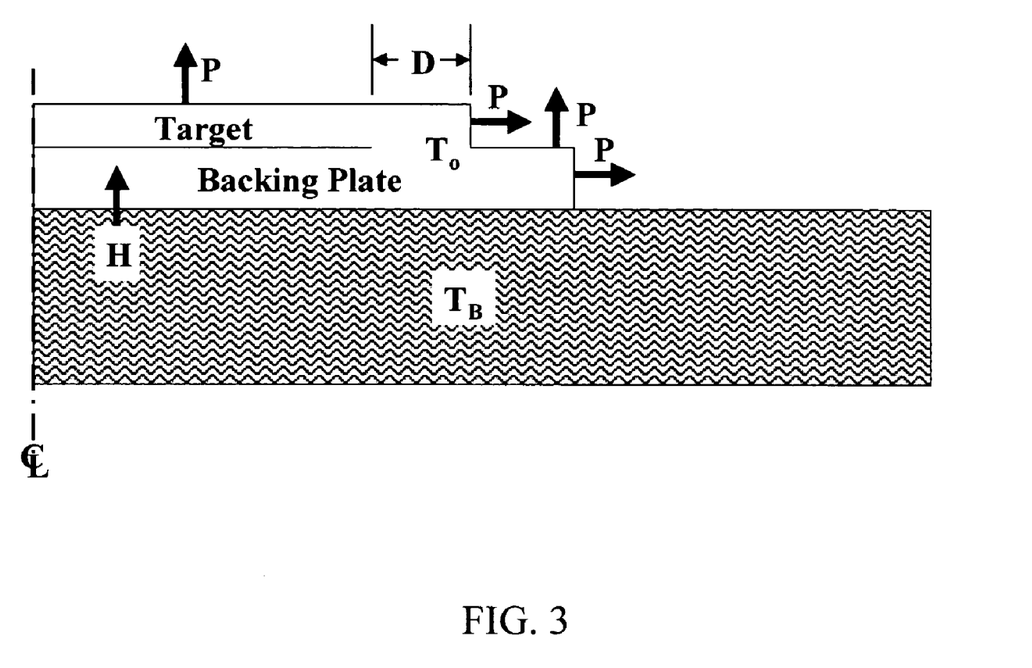
FIG. 3 is a schematic diagram showing a heat transfer model during sputtering target assembly heating according to an embodiment the present invention.

An observed time-temperature curve for individual pixels in the pixel matrix can be produced from the normalized temperatures obtained in the manner described above. In turn, the observed time-temperature curves can be compared to corresponding known or expected time-temperature curves to determine the integrity of the bond interface. Expected time-temperature curves can be modeled using finite element methods to provide an understanding of the way that heat flows and temperature varies across the surface area of the imaged assembly member during the imaging. FIG. 3 provides a schematic diagram of a possible heat transfer model. H is the convective heat transfer coefficient between, in this case, the heat source and the sputtering target assembly. The effect of variation in H on the resulting thermal images and the sensitivity of the measurement can be determined using finite element analysis (FEA) modeling. $T_B$ represents the temperature of the heat source. A calculation similar to Eq. 1 can be used in which $T_B$ is substituted for $T_f(x,y)$. In this case, the difference between the equilibrium temperature of the assembly member and the heat source (or heat sink) temperature provides a measure of the emissivity correction for the camera and a method for determining, P, the convective heat transfer coefficient at the sputtering target assembly/air interfaces.

Figure 4:
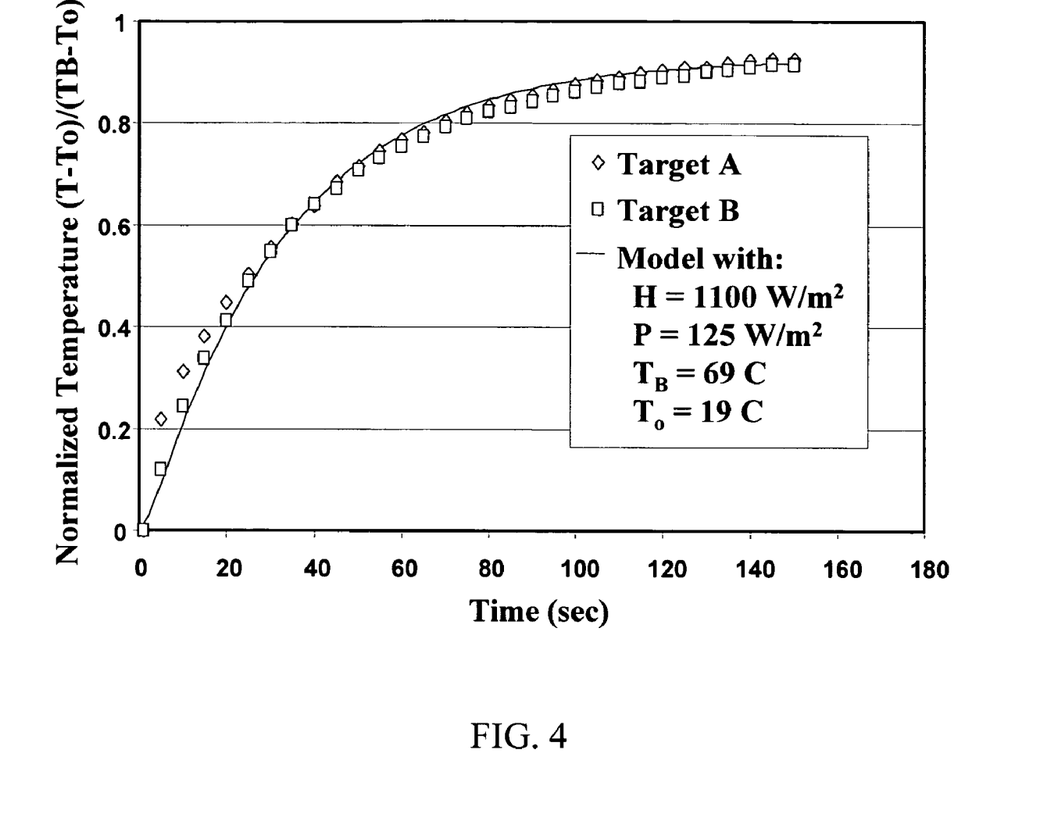
FIG. 4 is a graph of time-temperature data obtained from two examples of sputtering target assemblies and the time-temperature curve expected from the FEA model.
Figure 5:
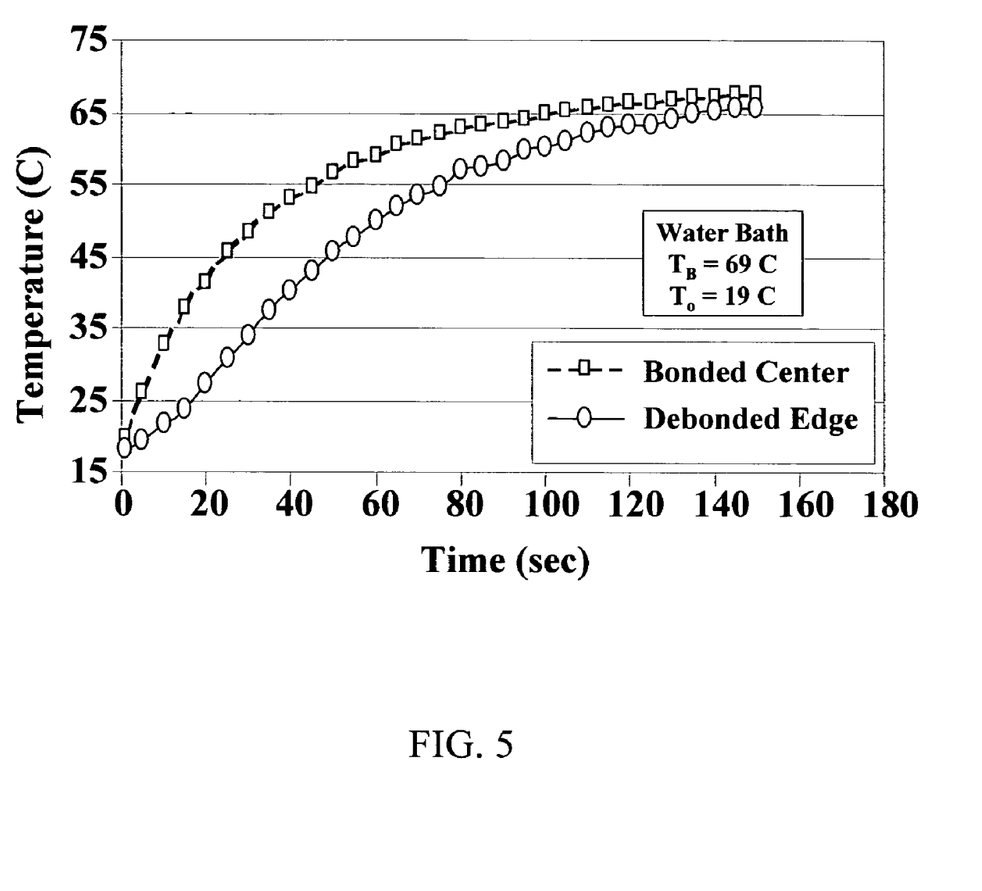
FIG. 5 is a graph of time-temperature data obtained at the center and edge areas on an example sputtering target assembly indicating a debond area at the target edge.

FIG. 4 provides experimental data for two Ta/Cu—Cr sputtering target assemblies and a comparison between this experimental data and the model prediction using FEA modeling. Excellent agreement was obtained between the model and the experimental data by fitting the parameters P and H. The values for P of 125 W/m$^2$ and H of 1100 W/m$^2$ for the water bath are reasonable and consistent with expected values (see Carslaw and Jaeger, "Conduction of Heat in Solids," Oxford Science Publications). FIG. 5 shows the difference between the time-temperature curves for a center region of the Ta/Cu—Cr sputtering target assembly in which it is well bonded, and a point at the edge of the assembly in which a debond is present between the sputter target and the backing plate.

According to one embodiment of the present invention, integrating a plurality of the observed time-temperature curves over at least a portion of the imaging time provides a method for reducing the time dependent temperature data to an observed integrated temperature for individual pixels, i.e., single data points for each pixel. The normalized integrated temperature, I(x,y) is obtained from Eq. 1 by simply integrating over the thermographic analysis time or:

$$I(x,y)=\int T_N(x,y,t)dt \quad \text{(Eq. 2)}$$

wherein the lower and upper limits of integration are zero and the maximum time used in the data set, respectively, or other time period. The integrity of the bond interface can be determined from a comparison of an observed normalized integrated temperature for individual pixels to corresponding reference integrated temperatures.

According to one embodiment of the present invention, calculating a difference between the reference integrated temperature and the observed integrated temperature for a plurality of individual pixels forms an integrated pixel map, wherein the integrity of the bond interface is represented by the integrated pixel map. For example, by subtracting pixel by pixel the measured $I_u(x,y)$ values for a sputtering target assembly from the reference $I_p(x,y)$ values from a map of a sputtering target assembly with a known good bond, the bond integrity map, $I_p$-$I_u$ can be obtained. $I_u$ is defined as the integrated normalized temperature map for the imaged assembly. $I_p$ is defined as the integrated normalized temperature map for a reference assembly having no debonded areas. Preferably, $I_p$ and $I_u$ are for sputtering target assemblies of similar geometry, which are measured sequentially with similar equipment. Where the $I_p$-$I_u$ values exceed the noise level for the measurement, then a defective bond can be identified in an area (x,y) of the assembly. If the $I_p$-$I_u$ values for all positions, (x,y), are within the noise limits for the measurement, then the sputtering target assembly can be considered as lacking debonded areas.

The imaged surface of the assembly member preferably has a consistent emissivity that is at least 0.1, and more preferably that is from about 0.5 to about 1, and most preferably as near to 1 as possible. In one embodiment of the present invention, a coating is provided on at least a portion of the imaged surface to increase the emissivity of the imaged surface. The coating preferably includes paint (e.g., black) or colloidal graphite. The coating preferably provides a surface with a consistent emissivity value of at least about 0.93. A thin paint layer on the imaged surface preferably has minimal effect on the coated surface temperature. A thermally conductive graphite coating (e.g., Aquadag) can be used to coat the imaged surface to increase surface emissivity and maintain good thermal conductivity at the surface.

According to one embodiment of the present invention, the thermographic system of evaluating the bond interface of a sputtering target assembly, as described above, generally includes an apparatus for heating (or cooling) an assembly member, and an imaging apparatus for recording and storing the time-temperature data for small sections or resolution elements of the surface of the assembly member being evaluated. In more detail, the thermographic system preferably includes a heat source (or heat sink) for heating (or cooling)

the backing plate; an imaging device for imaging at least a portion of a surface of the sputter target via infrared thermography to acquire a sequence of thermographic images of individual pixels of a pixel matrix for a predetermined imaging time to produce an observed time-temperature curve for individual pixels; and a computing device for comparing the observed time-temperatures curves to reference time-temperature curves to determine the integrity of the bond interface.

According to one embodiment, the thermographic analysis includes imaging at least a portion of a surface of the non-heated (or noncooled) assembly member, e.g., the sputter target, via infrared thermography to acquire at least one thermographic image of individual pixels of a pixel matrix at a predetermined point of the heating (or cooling) or imaging time. The thermographic image(s) can then be compared with a reference image corresponding to the predetermined imaging time to determine the integrity of the bond interface. Any device can be used to obtain the thermographic image(s), including an IR camera that is capable of taking individual still images, as well as any IR video camera known in the art.

Emissivity of the surfaces imaged using the thermographic camera can be important. Various means for increasing the emissivity of metals with low emissivity are available and can be used. One method is to use flat black paint to improve the emissivity of the metal without degrading the sensitivity of the measurement. Other methods that have been used for increasing the surface emissivity include coating the imaged surface with powders such as salt, sugar and cornstarch to preferably form a powdered layer. A preferred method for emissivity improvement is to use thin black electrical tape or a thin layer(s) of polymer that is in close contact with the target surface.

The present invention will be further clarified by the following examples, which are intended to be exemplary of the present invention.

EXAMPLES

Figure 6:
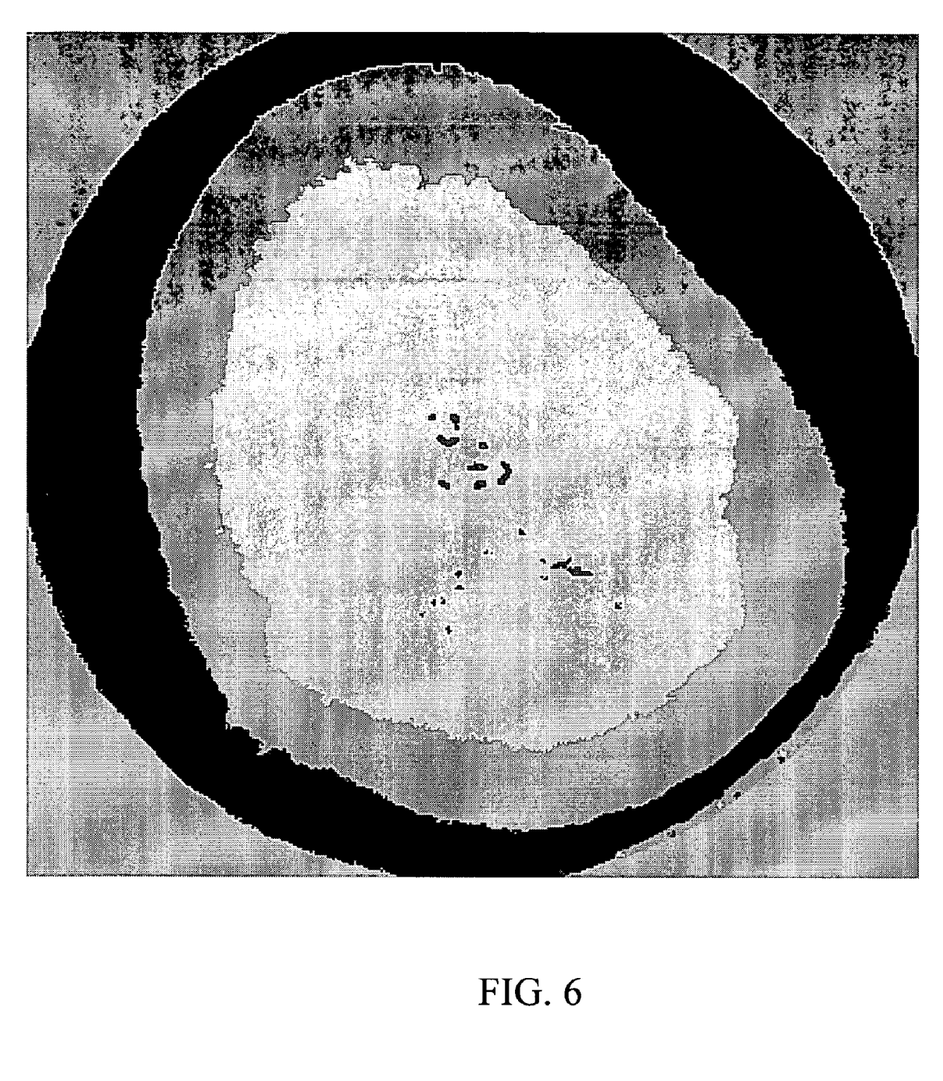
FIG. 6 is a graphic image of an integrated normalized temperature map produced by a method according to the present invention in which the sputtering target assembly has substantially no debonded areas.
Figure 7:
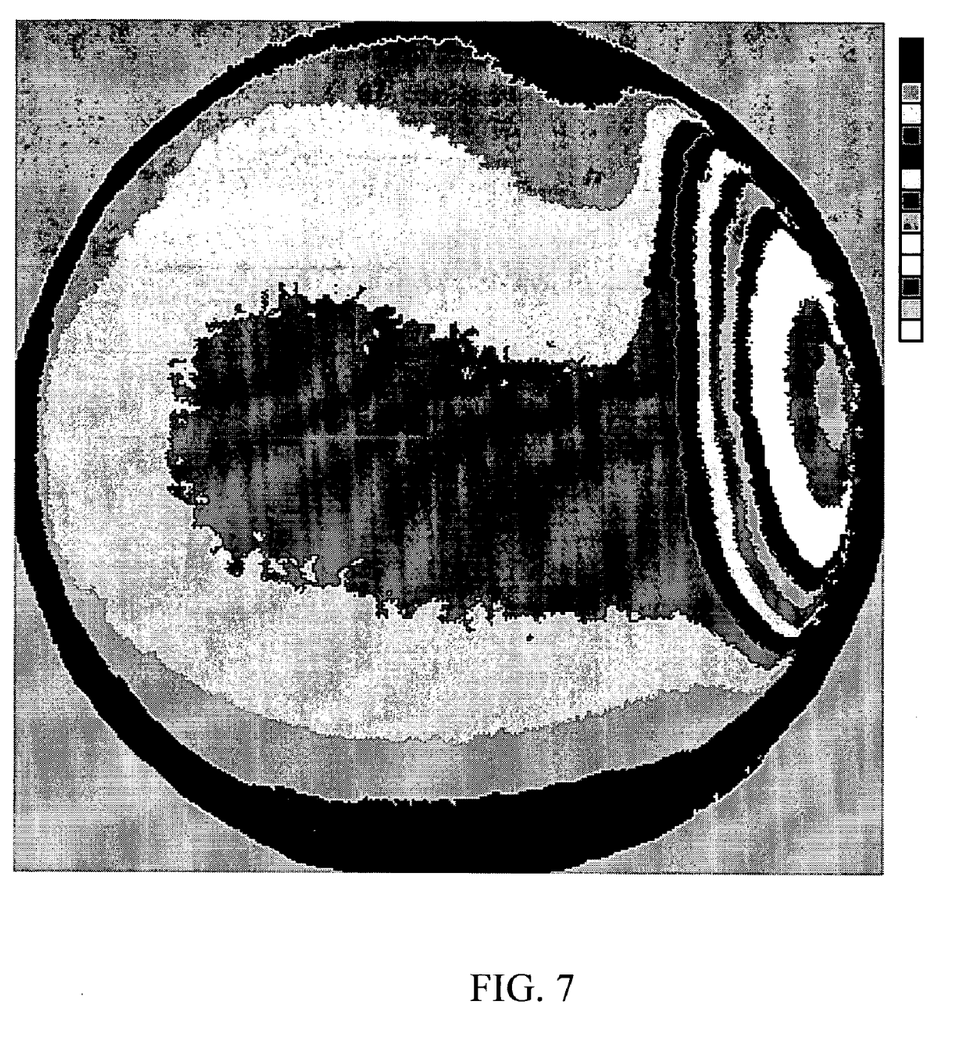
FIG. 7 is a graphic image of an integrated normalized temperature map produced by a method according to the present invention in which the sputtering target assembly has debonded areas.

Results obtained using a water bath heating process according to the present invention are illustrated as integrated pixel maps in FIGS. 6 and 7 for a sputtering target assembly comprising a Ta sputter target diffusion bonded to a Cu—Cr backing plate. In the example shown in FIG. 6, the sputter target is well bonded to the backing plate. The variation observable in the map is due to the assembly geometry and the thermal gradients created in the assembly during the heating process. In the example shown in FIG. 7, the map indicates that the sputtering target assembly has a substantial debond area. The thermographic analysis according to the present invention readily detected the edge debond as well as a less severe debond in the center of the sputtering target assembly. Both the edge and center debonds were confirmed by ultrasonic testing (UT). The maps in FIGS. 6 and 7 were obtained by integrating the time-temperature curves for each pixel in each frame as described in detail above.

Figure 8:
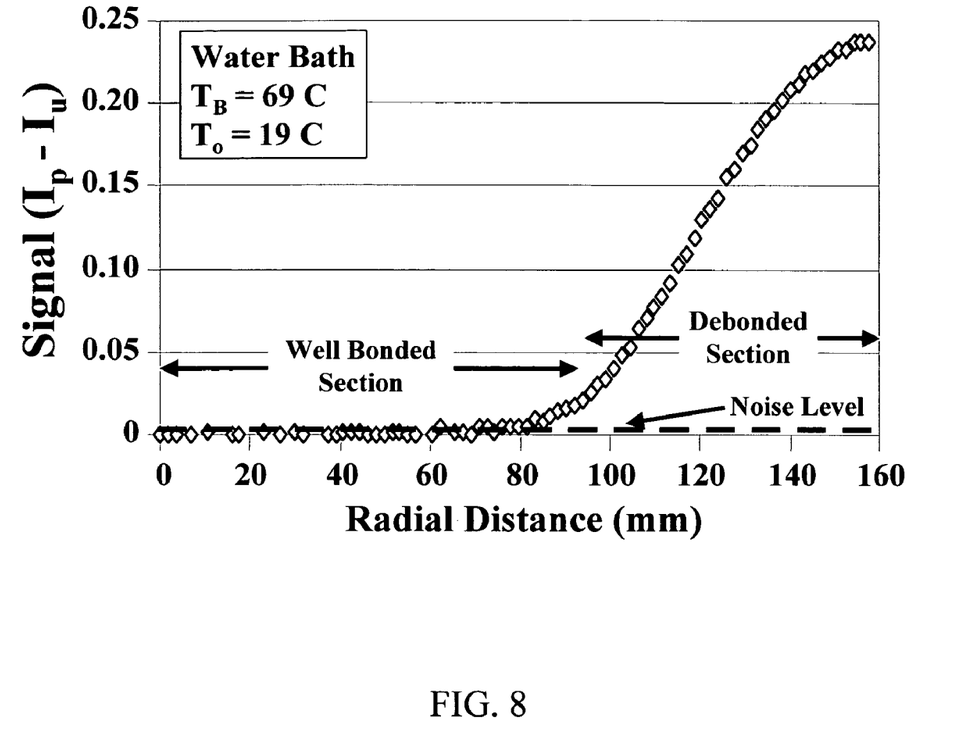
FIG. 8 is a graph of theoretical radial variation in the signal ($I_p$-$I_u$) for an example of the sputtering target assembly having a debond at the target outer diameter.

FIG. 8 shows the signal ($I_p$-$I_u$) obtained by subtracting the radial integrated normalized temperature from an assembly with a large debond area from the radial integrated normalized temperature of a well-bonded assembly. In regions in which both assemblies are well-bonded, the value of $I_p$-$I_u$ is, within the noise level, approximately equal to zero. In regions in which the assembly is debonded, the value of $I_p$-$I_u$ is larger than zero. The noise level can be estimated from the variation in the signal where the assembly is well bonded. For instance, a noise level of 0.005 can be found. This value is consistent with the error introduced from the camera sensitivity, which is preferably about +/−0.1° C., and a difference between the heat source temperature and ambient temperature of about 35° C. The signal variation with radius shown in FIG. 8 has a noticeable change in slope in the region in which the signal begins to increase above zero. The region lies between 80 and 95 mm radius in FIG. 8. As described below, this inflection in the radial signal curve provides a measure of the precise location of the debond in the x-y plane of the sputtering target assembly. For the sputtering target assembly shown in FIG. 8, an estimated radial debond length extends inward 65 mm from the outside edge of the sputter target.

Figure 9:
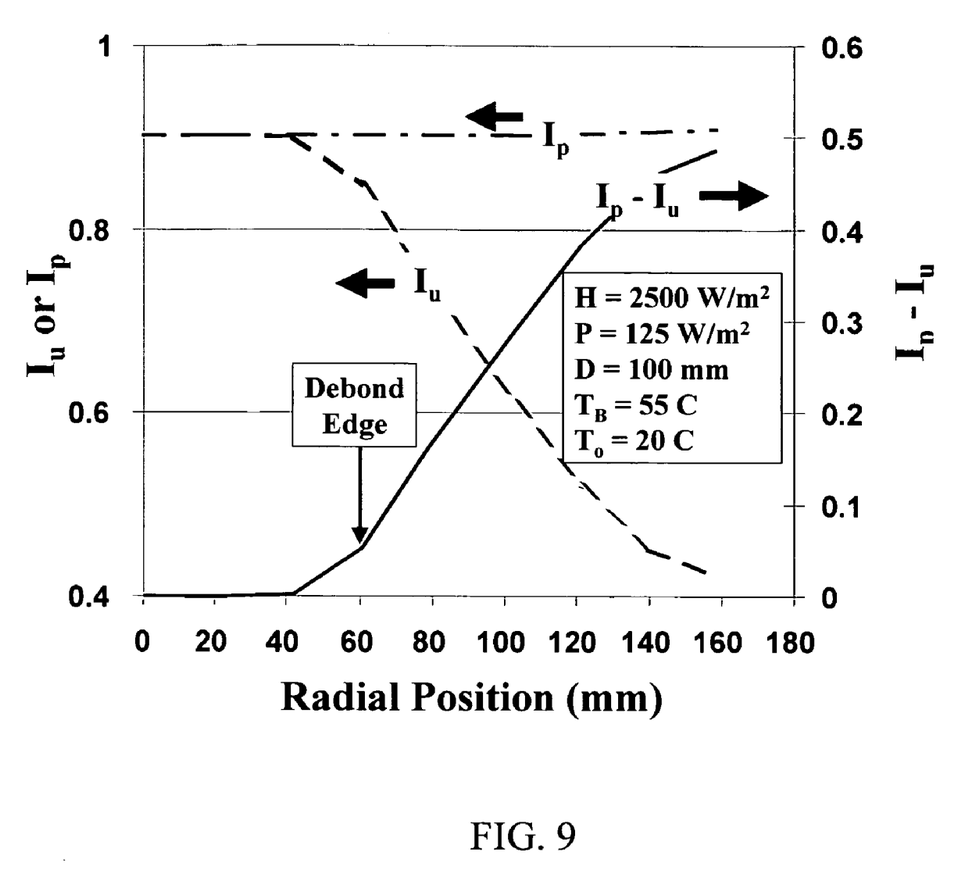
FIG. 9 is a graph of finite element model results for $I_p$-$I_u$ for a 10 cm-wide edge debond in an example of the sputtering target assembly.

The values for $I_p$, $I_u$ and $I_p$-$I_u$ are provided as a function of the radial location in FIG. 9 for a Ta/Cu—Cr sputtering target assembly with a debond extending 100 mm from the outside edge of the target. This data was obtained from a finite element analysis of the transient heat flow in a Ta/Cu—Cr sputtering target assembly. $I_p$ and $I_u$ are shown as nearly equal in areas far removed from the debond. Accordingly, in these areas, $I_p$-$I_u$ goes to zero. The shape of the $I_p$-$I_u$ curve in the debond region is very similar to the shape of the curve obtained experimentally and shown in FIG. 8. The model also predicts that an inflection in the curve will occur in the area near the edge of the debond. In this case the debond length is 100 mm. The inflection in the curve is thus found from the modeling to be due to the shift in time-temperature curves that occur in regions of the target material near the debond edge as the heat transfer transitions from vertical flow to lateral flow. Lateral heat flow is required to heat the target material in the debonded area and vertical heat flow occurs where the target assembly is well-bonded. Consequently, from the shape and location of the inflection in the $I_p$-$I_u$ values as a function of target radius, accurate determination of the debond edge location can be made.

Figure 10:
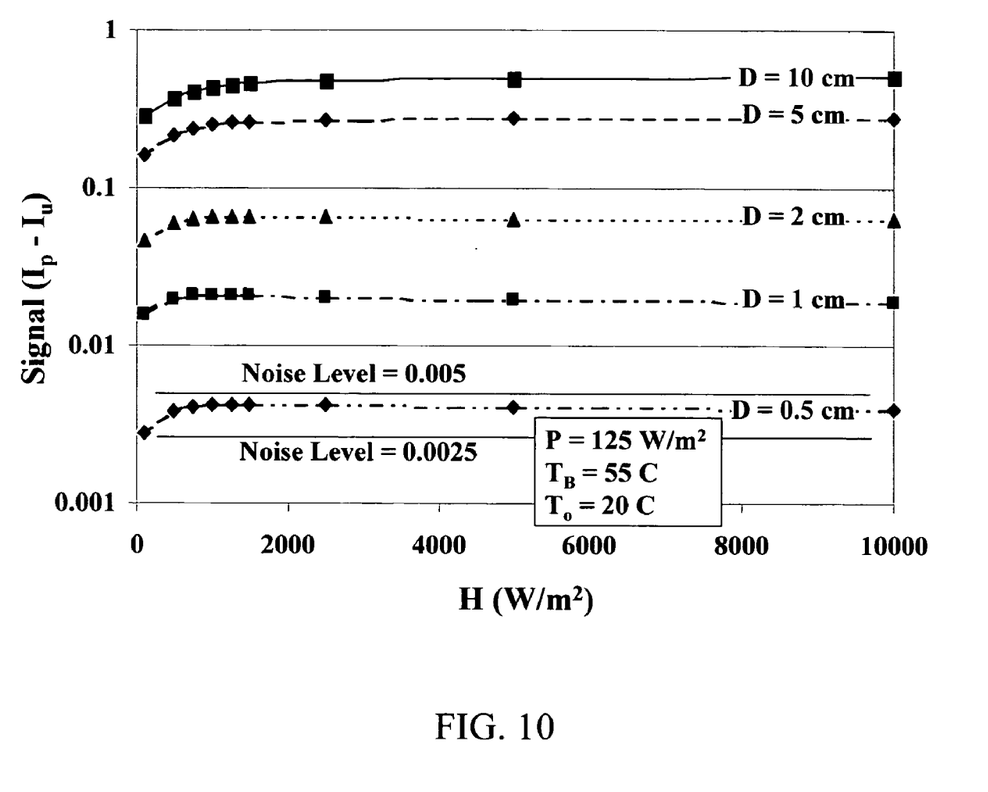
FIG. 10 is a graph of FEA model calculations for the expected signal ($I_p$-$I_u$) for various convective heat transfer coefficients between the heat source or heat sink, and the sputtering target assembly.

The sensitivity of the measurement can change with the defect length, D, and the heat transfer coefficient, H, between the heating or cooling fluid and the sputtering target assembly. The results of a finite element analysis of this problem are provided in FIG. 10 for a Ta/Cu—Cr sputtering target assembly having a tantalum target thickness of 6.3 mm, and a backing plate thickness of 7.5 mm. As D increases the signal, $I_p$-$I_u$, increases. With a noise level ranging between 0.0025 and 0.005, an edge debond with a length of 5 mm would just be possible to detect. The measurement is not very sensitive to variation in H, once H is greater than about 1000 W/m². The optimum value for H is found to be around 2500 W/m². Lowering H below about 1000 W/m² lowers sensitivity of the measurement while increasing H greatly above 2500 W/m² only increase the signal by a small amount for large D and actually decreases the signal for small D. Therefore, a preferred method according to the present invention is to provide a heat transfer coefficient between the target assembly and the heating or cooling fluid of between about 1000 and about 2500 W/m². This corresponds to a heating rate for induction or convection heating of 2° C./sec.

The previously described versions of the present invention have many advantages, including the time for analysis of a sputtering target assembly can be less than five minutes, independent of the size of the sputtering target assembly.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

What is claimed is:

1. A method of evaluating a bond interface of a sputtering target assembly, comprising:
   providing a sputtering target assembly;
   conducting a thermographic analysis of said sputtering target assembly, wherein said thermographic analysis comprises:
      heating said backing plate with a heat source;
      imaging at least a portion of a surface of said sputter target via infrared thermography to acquire at least one thermographic image of individual pixels of a pixel matrix at a predetermined imaging time; and
   comparing said at least one thermographic image to a reference image corresponding to said predetermined imaging time to determine an integrity for said bond interface; and
   wherein said sputtering target assembly comprises a backing plate bonded to a sputter target at said bond interface, and a layer is applied to a surface of the sputtering target assembly to increase emissivity.

2. The method of claim 1, wherein said sputtering target assembly comprises a planar cathode or a hollow cathode magnetron.

3. The method of claim 1, wherein said sputter target is tantalum or a tantalum alloy, and said backing plate is copper or a copper alloy.

4. The method of claim 1, wherein said sputter target comprises aluminum, titanium, copper, cobalt, niobium, gold, platinum, palladium, nickel, hafnium, molybdenum, zirconium, tantalum, or alloys thereof.

5. The method of claim 1, wherein said backing plate comprises copper, aluminum, titanium, alloys thereof, or steel.

6. The method of claim 1, wherein said bond interface between said sputter target and said backing plate is a diffusion bond, an explosion bond, a soldered bond, a brazed bond, a welded bond, a friction weld bond, a press metal fit bond, a thermal expansion coupling bond, or a press fit bond between intercalated protrusions and grooves.

7. The method of claim 1, wherein a convective heat transfer coefficient between said sputtering target assembly and a heat source or a heat sink is from about 500 to about 20,000 $W/m^2$.

8. The method of claim 1, wherein the heating rate of the target assembly is in the range of from 0.1 to 10 C/sec.

9. The method of claim 1, wherein said thermographic analysis further comprises:
   acquiring a sequence of thermographic images of individual pixels of a pixel matrix for a predetermined imaging time to produce an observed time-temperature curve for individual pixels; and
   comparing said observed time-temperature curves to corresponding reference time-temperature curves to determine an integrity for said bond interface.

10. The method of claim 9, further comprising:
    integrating said observed time-temperature curves for a plurality of said individual pixels over at least a portion of said imaging time to obtain an observed integrated temperature for said plurality of said pixels; and
    comparing said observed integrated temperature to a corresponding reference integrated temperature to determine the integrity of said bond interface.

11. The method of claim 10, further comprising calculating a difference between said reference integrated temperature and said observed integrated temperature for a plurality of said individual pixels to form an integrated pixel map, wherein the integrity of said bond interface is represented by said integrated pixel map.

12. The method of claim 9, wherein said sequence of thermographic images is obtained at a frequency of from about 0.01 to about 10 frames/sec.

13. The method of claim 9, wherein said heat source comprises a fluid.

14. The method of claim 13, wherein said fluid comprises water, ethylene glycol, cesium formate, or any combination thereof.

15. The method of claim 9, wherein said heat source comprises a liquid bath or a liquid spray.

16. The method of claim 9, wherein said heat source comprises a gas.

17. The method of claim 16, wherein said gas comprises hot air, helium, argon, nitrogen, or any combination thereof.

18. The method of claim 9, wherein said heat source comprises radiant heat or conductive heat.

19. The method of claim 9, wherein said heat source has a specific heat capacity of at least about 4,000 J/Kg·K.

20. The method of claim 9, wherein said portion of said surface of said sputter target includes an emissivity of at least about 0.5.

21. The method of claim 9, further comprising providing said layer as a coating on said portion of said surface of said sputter target, wherein said coating increases an emissivity of said portion of said surface of said sputter target.

22. The method of claim 21, wherein said coating comprises paint or colloidal graphite.

23. The method of claim 9, wherein a convective heat transfer coefficient between said heat source and said backing plate is from about 500 to about 20,000 $W/m^2$.

24. The method of claim 9, wherein said infrared thermography comprises an infrared camera having a thermal sensitivity of from about 0.01 to about 1° C.

25. The method of claim 9, wherein said imaging time is of from about 1 to about 500 sec.

26. A method of evaluating a bond interface of a sputtering target assembly, comprising:
    providing a sputtering target assembly comprising a backing plate bonded to a sputter target at a bond interface;
    providing a coating or layer on a portion of a surface of said sputter target, wherein said coating or layer increases an emissivity of said portion of said surface of said sputter target;
    conducting a thermographic analysis of said sputter target assembly, wherein said thermographic analysis comprises:
       cooling said backing plate with a heat sink;
       imaging at least said portion of said surface of said sputter target via infrared thermography to acquire a sequence of thermographic images of individual pixels of a pixel matrix for a predetermined imaging time to produce an observed time-temperature curve for individual pixels; and
    comparing said observed time-temperature curves to corresponding reference time-temperature curves to determine an integrity for said bond interface; and
    generating an output of results associated with the thermographic analysis.

27. The method of claim 26, further comprising:
    integrating said observed time-temperature curves for a plurality of said individual pixels over at least a portion of said imaging time to obtain an observed integrated temperature for said plurality; and comparing said observed integrated temperature to a corresponding reference integrated temperature to determine an integrity for said bond interface.

28. The method of claim 27, further comprising calculating a difference between said reference integrated temperature and said observed integrated temperature for a plurality of said individual pixels to form an integrated pixel map, wherein the integrity of said bond interface is represented by said integrated pixel map.

29. The method of claim 26, wherein said sequence of thermographic images is obtained at a frequency of from about 0.01 to about 1 frames/sec.

30. The method of claim 26, wherein said heat sink comprises a fluid.

31. The method of claim 30, wherein said fluid comprises water, ethylene glycol, cesium formate, or any combination thereof.

32. The method of claim 26, wherein said heat sink comprises a liquid bath or a liquid spray.

33. The method of claim 26, wherein said heat sink comprises a gas.

34. The method of claim 33, wherein said gas comprises air, helium, argon, nitrogen, or any combination thereof.

35. The method of claim 26, wherein said heat sink has a specific heat capacity of at least about 4,000 J/Kg·K.

36. The method of claim 26, wherein said portion of said surface of said sputter target includes an emissivity of at least about 0.5.

37. The method of claim 26, wherein said coating comprises paint or colloidal graphite.

38. The method of claim 26, wherein a convective heat transfer coefficient between said heat sink and said backing plate is from about 500 to about 20,000 W/m$^2$.

39. The method of claim 26, wherein said infrared thermography comprises an infrared camera having a thermal sensitivity of from about 0.01 to about 1° C.

40. The method of claim 26, wherein said imaging time is from about 1 to about 500 sec.

41. The method of claim 1, wherein said layer is a powdered layer.

42. The method of claim 1, wherein said layer is a plastic layer.

43. The method of claim 1, wherein said thermographic analysis include heating said sputtering target assembly.

44. The method of claim 43, wherein said heating is induction heating.

45. The method of claim 44, wherein said induction heating is with a least one induction coil.

46. The method of claim 43, wherein said heating is with a device that induces eddy currents in the target assembly or portion thereof.

* * * * *